United States Patent [19]

Bennett et al.

[11] Patent Number: 4,513,352
[45] Date of Patent: Apr. 23, 1985

[54] THERMAL PROTECTION APPARATUS

[75] Inventors: Gloria A. Bennett; Michael G. Elder, both of Los Alamos; Joseph E. Kemme, Albuquerque, all of N. Mex.

[73] Assignee: The United States of America as represented by the United States Department of Energy, Washington, D.C.

[21] Appl. No.: 591,650

[22] Filed: Mar. 20, 1984

[51] Int. Cl.³ .............................................. H05K 7/20
[52] U.S. Cl. .................................... 361/385; 62/437; 165/DIG. 4; 174/15 HP
[58] Field of Search ............ 62/119, 437; 174/15 HP; 165/DIG. 4, 47 H, 47 A; 361/385, 386, 388, 389, 380

[56] References Cited

U.S. PATENT DOCUMENTS

| | | | |
|---|---|---|---|
| 3,038,074 | 6/1962 | Scherbatskoy | 165/DIG. 4 |
| 3,048,374 | 8/1962 | Hughes | 361/382 |
| 3,105,148 | 9/1963 | Monaghan et al. | 165/DIG. 4 |
| 3,258,593 | 6/1966 | Reed et al. | 165/DIG. 4 |
| 3,265,893 | 8/1966 | Rabson et al. | 165/DIG. 4 |
| 3,435,629 | 4/1969 | Hallenburg | 62/119 |
| 4,184,539 | 1/1980 | Rein | 165/80 B |
| 4,330,812 | 5/1982 | Token | 361/386 |
| 4,340,405 | 6/1982 | Steyert, Jr. et al. | 62/437 |
| 4,407,136 | 10/1983 | de Kanter | 62/119 |

Primary Examiner—A. D. Pellinen
Assistant Examiner—Gregory D. Thompson
Attorney, Agent, or Firm—Lee W. Huffman; Paul D. Gaetjens; Judson R. Hightower

[57] ABSTRACT

An apparatus which thermally protects sensitive components in tools used in a geothermal borehole. The apparatus comprises a Dewar within a housing. The Dewar contains heat pipes such as brass heat pipes for thermally conducting heat from heat sensitive components to a heat sink such as ice.

5 Claims, 1 Drawing Figure

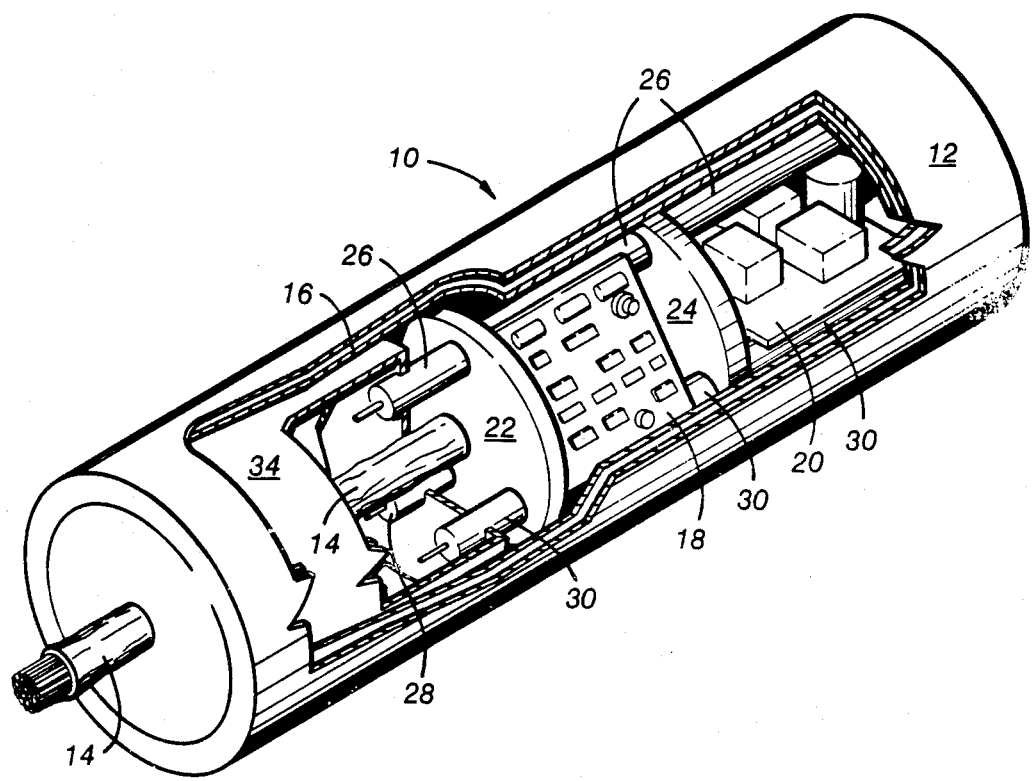

THERMAL PROTECTION APPARATUS

The invention is the result of a contract with the Department of Energy (Contract No. W-7405-ENG-36).

BACKGROUND OF THE INVENTION

The invention described herein relates generally to thermal protection structures for downhole tools and more particularly to an improved thermal protection apparatus for downhole electronics used in making geotechnical measurements.

Existing devices for controlling the temperature of heat-sensitive components in downhole applications in geothermal work utilize conduction and natural convection to transfer heat from an electronics compartment to a heat sink. Typically the only high conductivity paths directly connected to the heat sink are conventional brass rods and a copper bulkhead. A commonly used heat sink is Wood's metal, a bismuth lead alloy. It is desirable to construct a thermal protection apparatus which will protect heat-sensitive electronic components in geothermal environments for periods of time longer than those achieved by conventional devices.

SUMMARY OF THE INVENTION

One object of the present invention is to provide higher conductance paths than brass rods can provide to remove heat from an electronics compartment and transfer it directly to a heat sink.

Another object of the present invention is to protect electronic components in a geothermal environment from radiation utilizing a Dewar.

To achieve the foregoing and other objects and in accordance with the purposes of the present invention as embodied and broadly described herein, there is provided an apparatus for thermally protecting heat-sensitive components of tools used in geothermal environments. The apparatus comprises a housing containing a Dewar and thermally conductive bulkheads disposed on either side of and thermally communicating with the heat-sensitive components. Heat pipes thermally connect and conduct heat from the heat-sensitive components to the bulkheads and therefrom to a heat sink of a suitable temperature, such as that of ice, so that there is a large thermal gradient and a desired potential. In a preferred embodiment the heat sink comprises ice and the heat pipes comprise internally threaded brass tubes to prvide wick means and a state-changing fluid in the heat pipes comprises methanol. The heat sink can be located above the heat-sensitive components.

One advantage of the present invention is that electronics in a geothermal environment are protected from heat for extended periods of time.

Yet another advantage of the present invention is that an embodiment thereof can be inexpensively manufactured and easily withdrawn from the hole and the melted ice therein can be refrozen to provide effective heat protection for electronic components.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF DESCRIPTION OF DRAWING

The accompanying drawing, which is incorporated in and forms a part of the specification, illustrates an embodiment of the present invention and, together with the description, serves to explain the principles of the invention. In the drawing:

The FIGURE shows a partial fragmentary view of a preferred embodiment of the invention.

DETAILED DESCRIPTION OF A PREFERRED EMBODIMENT OF THE INVENTION

Reference is now made to the FIGURE which illustrates a preferred embodiment of the device 10 comprising a housing 12 which is suspendible into a geothermal borehole and connected electrically and mechanically to a cable 14. Contained within housing 12 and spaced therefrom by spacers (not shown) is a Dewar 16 containing electronic components 18 and other heat-sensitive devices 20 which are connected to copper bulkheads 22 and 24 by heat pipes 26, 28 and 30. In a preferred embodiment the heat pipes 26, 28, and 30 comprise internally threaded brass tubes to provide wick means and are assisted by gravity. A state-changing fluid in the heat pipes 26, 28, and 30 comprises methanol in a preferred embodiment. The cable 14 is connected to the bulkhead 22 and then to the electronic components 18 and other devices 20 through apertures (not shown) in the center of the copper bulkheads 22 and 24. A heat sink housing 34 is placed in one end of the device 10 and, before the device 10 is lowered into a geothermal borehole, it is filled with ice. Preferably the heat sink housing 34 is located above the electronic components 18 and other devices 20.

In operation, after the heat sink housing 34 is filled with ice (not shown) the device 10 is lowered into a geothermal borehole. Readings are made and operations are performed. While the device 10 is within the borehole, heat conducted and radiated to the electronic components 18 as well as heat generated within them is transferred therefrom by heat pipes 26, 28, and 30 in contact therewith to copper bulkheads 22 and 24 and then to heat sink housing 34 and the ice therein.

The device 10 described as the preferred embodiment increased survival time at geothermal temperatures by a factor of four over the use of the simple brass rods of the prior art devices. This preferred device 10 maintained a suitable temperature for ten hours at 235° C.

The foregoing description of the preferred embodiment of the invention has been presented for purposes of illustration and description. It is not intended to be exhaustive or to limit the invention to the precise form disclosed, and obviously many modifications and variations are possible in light of the above teaching. The embodiment was chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. Apparatus which thermally protects heat-sensitive components in tools used in geothermal boreholes, said apparatus comprising:

a. a housing;

b. a Dewar disposed within said housing;
c. thermally conductive bulkheads disposed within said Dewar and on either side of and thermally communicating with the heat-sensitive components;
d. a heat sink of suitable temperature disposed within said Dewar; and
e. a heat pipe conducting heat from the components through said bulkheads and to said heat sink.

2. The invention of claim 1 wherein said heat sink comprises ice.

3. The invention of claim 1 wherein said heat sink is located above the heat-sensitive components.

4. The invention of claim 1 wherein said heat pipe comprises a state-changing fluid within a hollow brass tube.

5. The invention of claim 4 wherein said state-changing fluid comprises methanol.

* * * * *